United States Patent [19]

Ady

[11] Patent Number: 5,325,951
[45] Date of Patent: Jul. 5, 1994

[54] PERIPHERAL CARD HEADER LEAD-IN ARRANGEMENT

[75] Inventor: Roger W. Ady, Lisle, Ill.

[73] Assignee: Motorola, Inc., Schaumburg, Ill.

[21] Appl. No.: 144,846

[22] Filed: Oct. 29, 1993

[51] Int. Cl.⁵ .......................................... B65G 11/00
[52] U.S. Cl. .......................................... 193/1; 193/38
[58] Field of Search .................. 193/1, 2 R, 38, 41, 193/45; 271/3, 3.1

[56] References Cited

U.S. PATENT DOCUMENTS

| | | | |
|---|---|---|---|
| 3,666,262 | 5/1972 | Fowler et al. | 271/3 X |
| 3,680,853 | 8/1972 | Houghton et al. | 371/3 |
| 4,244,642 | 1/1981 | Toriumi et al. | 271/3 X |

Primary Examiner—D. Glenn Dayoan
Attorney, Agent, or Firm—Donna Rogers Maddox

[57] ABSTRACT

A peripheral card header (100) is disclosed including an alignment device (160) and a hold-down anchor (230). The peripheral card header (100) is for mounting on a surface (110) and has application in portable electronic devices, such as electronic organizers. The hold-down anchor (230) has a lead-in feature (430) to allow a peripheral card (310) to be inserted without snagging or otherwise jamming before the complete insertion of the card.

7 Claims, 1 Drawing Sheet

PERIPHERAL CARD HEADER LEAD-IN ARRANGEMENT

TECHNICAL FIELD

The present invention relates generally to peripheral card headers and more specifically to a peripheral card header lead-in arrangement that offers anti-jamming protection during insertion of an associated peripheral card.

BACKGROUND OF THE INVENTION

Present day trends in the electronic industry are towards miniaturazation and standardization of components. With small size, light weight, and overall ruggedness being requirements for portable devices, the problem must be solved of supplying peripheral and other expansion capabilities to small, general-purpose computing and consumer electronic devices. One solution to the problem is standardized memory and I/O cards to provide this expansion capability.

With the application of the products being the general consumer market, the products must be rugged and easy to use. It is within these constraints that peripheral cards must operate in order to solve interchangability and expandability problems.

With space being at a premium in portable products, it is often desirable to have the peripheral cards slide flush along printed circuit boards, and the like, during insertion and removal operations. This saves vertical space and the need for an additional horizontal guide surface is avoided. This configuration presents a problem, however, as the bottom edge of the peripheral card tends to stub against the peripheral card connector lead-in on present day known designs. Forming a sharp enough lead-in that will stay firmly on the circuit board has proved to be infeasible from a manufacturability viewpoint.

Clearly an urgent need exists, in the exploding portable electronics market, to provide a peripheral card header lead-in arrangement that will prevent stubbing during peripheral card insertion and removal operations and will also secure the peripheral card header firmly to the surface on which it is resident.

SUMMARY OF THE INVENTION

In practicing the invention, a peripheral card header assembly is provided for receiving an associated peripheral card, which assembly arrangement includes an anti-jam feature in the form of self-aligning elements for guiding the inserted card onto appropriate guide rail surfaces within the header assembly. A suitable three-sided frame assembly is provided, open at the front, to receive the intended peripheral card. This assembly includes alignment structural elements for aligning the card in both the horizontal and vertical directions while additionally guarding against any snagging or jamming of the card being inserted. Such structure further provides a guiding action for the card into its final connected position. A hold-down arrangement in the form of a sloping ramp, culminating in an anchor pin, is further provided for retaining the forward edge of the header assembly securely on the mounting surface. This upwardly sloping or angled ramp is effective for guiding the peripheral card onto and within the frame assembly. This ramp itself extends below the associated mounting surface so as to avoid any presentation of a projecting edge or surface which may otherwise give rise to possible jamming between card and frame assembly upon its insertion therein.

BRIEF DESCRIPTION OF THE DRAWINGS

The features of the present invention which are believed to be novel are set forth with particularity in the appended claims. However, the invention together with further advantages thereof, may best be understood by reference to the accompanying drawings in which:

DETAILED DESCRIPTION OF A PREFERRED EMBODIMENT

Generally the present invention provides an apparatus and method of providing physical guidance for insertion of peripheral cards—including standardized and proprietary memory cards, processing cards, modem cards, access cards, application cards, I/O device cards, and similar plug-in modules—in a portable environment where small size, light weight, and overall ruggedness are requirements. This is accomplished by an inventive configuration, comprising a peripheral card header chassis with a lock-down tab which extends below the surface on which the chassis is generally mounted. The tab is tapered below the surface such that a peripheral card sliding in close proximity to the surface will not impinge on the otherwise vertical edge of the chassis, but rather will be lifted up onto the side guide rails thereof. A preferred embodiment of the present invention supports both Type I format and Type II format memory cards as established in the Personal Computer Memory Card International Association (PCMCIA) Card Interface Release 2.0 industry standard, published by the Personal Computer Memory Card International Association, 1030B East Duane Avenue, Sunnyvale, Calif.

Figure 1:
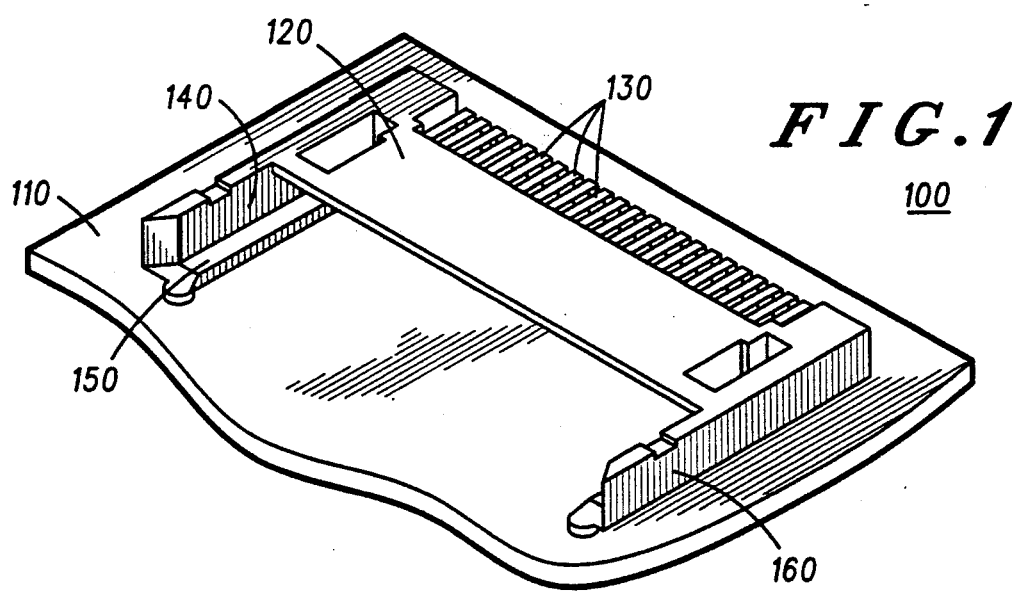
FIG. 1 shows a perspective view of a peripheral card header assembly mounted on a surface, which assembly has been constructed in accordance with a preferred embodiment of the present invention.

Referring now to the drawings, a peripheral card header assembly (100) is shown in FIG. 1 which has been constructed in accordance with the present invention. Assembly (100) is positioned coincident with a mounting surface (110). In practice, a peripheral card, i.e., one configured to PCMCIA standards or possibly some other non-standard memory application or modem card, is inserted along the surface (110) until it impinges on the alignment means—in this case a sloping ramp (160)—of the header frame assembly (120). At this point, the card must be elevated from the surface (110) onto the horizontal surfaces or guide rails (150) which, along with the vertical surfaces or guide rails (140) thereof, constrain the movement of the card so as to channel the card into the all-surrounding frame assembly (120). Given that physical alignment has thus been properly established, the electrical interface will be achieved when receiving pins (130) protrude into or otherwise contact the appropriate mating detail on the card, (not here specifically shown, but well known in the art) such that further description is deemed unnecessary.

An elevation mechanism to raise the card onto the horizontal guide rails (150) is necessitated in the preferred embodiment of the present invention by the need to accommodate both a Type I format and a Type II format PCMCIA card in the peripheral card header assembly (100). As is well known (but not here specifically shown) a Type II format card has raised or bulged sections which protrude from the top and bottom of the card in the central portion, but do not widen the card along the edges or along the mating front face. As a result, the vertical position of the receiving pins (130) relative to the surface (110) must be increased by a prescribed amount to provide the requisite clearance for the bottom bulged section of the card. In a Type I format card, on the other hand, a continuously rectangular cross-section is presented (having no such bulged sections), and thus will ride directly on the surface (110). As a result, a Type I format card needs to be elevated to mate with the receiving pins (130), whose position is determined by the need to accommodate the larger Type II format card as referenced above.

Without more, however, the insertion of a peripheral card, of whatever configuration, has in the past given rise to frequent jamming-up in the header assembly (100) during an attempted card insertion operation. This is primarily due to the forward edge of the associated card forming a sharp acute angle which then digs into a surface area or fails to elevate to a sufficient degree to be able to ride on provided guide rails in the header assembly. In either case, a jam occurs.

Figure 3:
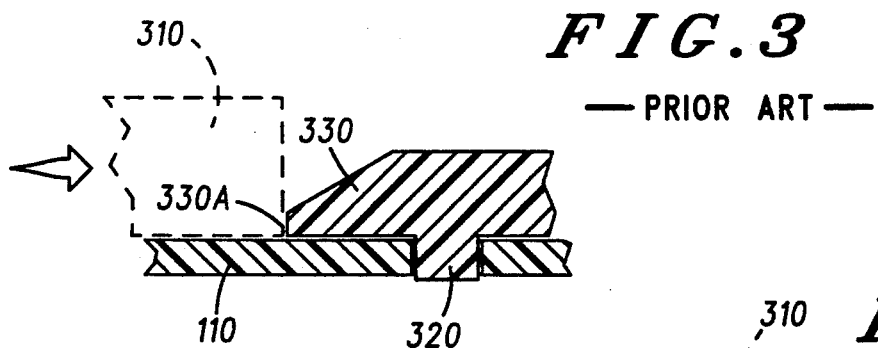
FIG. 3 shows a fragmentary cross-sectional view of a peripheral card header lead-in arrangement typical of that which may be found in the prior art.

This may be more fully appreciated with reference to FIG. 3 which shows a cross-section of the leading edge of a peripheral card header lead-in arrangement having a tapered alignment means (330) functioning to elevate the card being inserted onto the horizontal guide rails (150) and vertical guide rails (140). A hold-down anchor pin (320) is provided to effect proper registration onto, and with, the surface (110). However, as is frequently the case, the leading edge (330a) of the alignment means, i.e., the inclined ramp (330) cannot in practice be molded to as sharp a point as desired by traditional thermoplastic molding processes and, moreover, the resulting flat as presented by ramp (330) is even more pronounced when molding with fiber-filled or particle-filled materials, as is common for precision connector parts such as a header assembly (100). The propensity for the leading edge (330a) of the peripheral card header (100) to lift during subsequent processing, especially solder reflow operations, can result in this same blunt-edge effect even if the material at the leading edge (330a) of the alignment means could be molded or machined into a sharp point.

A likely outcome of such a raised or blunt edge (330a) will be that the inserted peripheral card shown in dotted line at (310) will catch on this blunted forward edge which will then inhibit further card insertion until the card can be forced to clear the same. Note also that in the preferred embodiment, the PCMCIA Type I format card leading edge is not itself tapered or rounded but rather a sharp right-angled edge, such that any vertical wall will impede the forward motion of the card.

Figure 2:
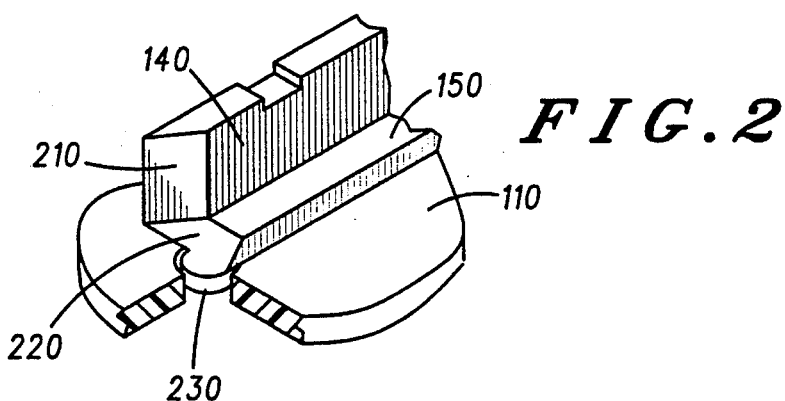
FIG. 2 is an enlarged fragmentary view in perspective of a lead-in feature forming an integral part of the assembly of FIG. 1.

The present invention overcomes these deficiencies by the provision of self alignment and anti-jam feature such as that illustrated in FIG. 2. In this configuration, constituting a more detailed illustration of the preferred embodiment, at least one of the alignment elements-horizontal guide rail (150) is provided at its leading edge in the manner depicted in FIGS. 2 and 4. It is at this leading edge where an associated peripheral card first impinges on the peripheral card header assembly (100) during card insertion. A hold-down means (230), in the form of an anchor pin or the like, is depicted mating into a cylindrical aperture to provide the proper registration between the peripheral card header assembly (100) and the surface (110) when properly mounted thereon. Other hold-down arrangements could of course be utilized for example using a dimple, blind hole, slot, or recess of any appropriate shape in the surface (110) to mate with an appropriately shaped protrusion on the peripheral card header assembly (100). In addition, a split post or other compliant protrusion design can be used to create an interference fit between the male detail on the peripheral card header assembly (100) and the female detail within the surface (110). Alternately, adequate clearances can be maintained so that the hold-down means (230) projects into the associated aperture in the surface (110) upon assembly but provides no locating assistance, such as a clearance fit. These various embodiments of hold-down means (230) are readily moldable in either metal or thermoplastic compounds with minimal tooling implications, as is well known in the art.

The angled front surface for the horizontal surface or ramp (220) can be seen to extend down into and terminate in the hold-down anchor pin (230), such that the front edge of the angled front surface for the horizontal surface or ramp (220) is below the surface (110) on which the card slides. This allows the card to glide up onto the horizontal guide rails (150) smoothly and without incident to the peripheral card header assembly (100). The angled front surface for the vertical surface (210) likewise guides the peripheral card onto the vertical surface (140).

Figure 4:
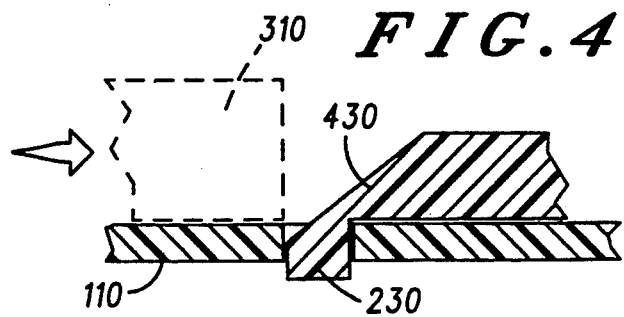
FIG. 4 shows a like fragmentary cross-sectional view of an improved peripheral card header lead-in arrangement utilized in the present invention that avoids the deficiencies of the prior art structures such as depicted in FIG. 3.

A more detailed description of the anti-jam structure embodied in the present invention is shown in FIG. 4, wherein a cross-section of the leading edge of the peripheral card header assembly is depicted. As will be noted, the upwardly angled lead-in ramp (430) projects below the surface (110) by extending downwardly to form the hold down anchor (230). This insures that the peripheral card (310) will not encounter a vertical edge during insertion. The magnitude of depth that the leading edge of the angled lead-in ramp (430) reaches below the surface (110) is a design variable, and as such could be established so that the edge remains below the surface (110) under worst-case piece-part tolerance and assembly tolerance conditions.

Thus it will be appreciated by those of ordinary skill in the art that the arrangement disclosed satisfies the urgent need of a smooth lead-in feature for the insertion of peripheral cards, along with the optional capability to firmly fasten the peripheral card header to the surface on which it is resident. Furthermore, these advantages are met within the size, weight, ruggedness, and ease of use requirements that are absolutely critical to the portable electronic products market.

It will be apparent to those skilled in the art that the disclosed invention may be modified in numerous ways and may assume many embodiments other than the preferred form specifically set out and described above.

Accordingly, it is intended by the appended claims to cover all modifications of the invention which fall within the true spirit and scope of the invention.

What is claimed is:

1. A peripheral card header assembly and arrangement for receiving a peripheral card, said arrangement providing an anti-jam feature for inserted cards and comprising in combination:

a three-sided frame assembly having:

alignment means for aligning said peripheral card in both horizontal and vertical directions, including means to guard against jamming and for guiding said peripheral card into its final connected position, and hold-down means for retaining said peripheral card header securely on a mounting surface, said hold-down means having an angled lead-in ramp for effecting said guiding action for said peripheral card onto and within said frame assembly, said ramp projecting below said mounting surface.

2. The peripheral card header assembly and arrangement as recited in claim 1, said alignment means further comprising:

a horizontal surface and a vertical surface, each having angled front surfaces for guiding said peripheral card into said frame assembly.

3. The peripheral card header assembly and arrangement as recited in claim 2, wherein said hold-down means is interference-fitted into at least one aperture in said surface.

4. The peripheral card header assembly and arrangement as recited in claim 2, wherein said hold-down means is clearance-fitted into at least one aperture in said surface.

5. The peripheral card header assembly and arrangement as recited in claim 2, wherein said hold-down means is interference-fitted into at least one recess in said surface.

6. The peripheral card header assembly and arrangement as recited in claim 2, wherein said hold-down means is clearance-fitted into at least one recess in said surface.

7. The peripheral card header assembly and arrangement as recited in claim 2, wherein said peripheral card substantially complies to the PCMCIA industry standard.

* * * * *